US006498468B2

(12) United States Patent
Thomsen

(10) Patent No.: US 6,498,468 B2
(45) Date of Patent: Dec. 24, 2002

(54) CIRCUIT ARRANGEMENT FOR THE SUPPLY OF AN ELECTRICAL COIL WITH A PREDETERMINED OPERATING CURRENT

(75) Inventor: Flemming Thomsen, Aabenraa (DK)

(73) Assignee: Sauer-Danfoss (Nordborg) A/S, Nordborg (DK)

( * ) Notice: Subject to any disclaimer, the term of this patent is extended or adjusted under 35 U.S.C. 154(b) by 0 days.

(21) Appl. No.: 09/875,637

(22) Filed: Jun. 6, 2001

(65) Prior Publication Data

US 2001/0050548 A1 Dec. 13, 2001

(30) Foreign Application Priority Data

May 30, 2000 (DE) .......................................... 100 26 938

(51) Int. Cl.[7] .............................. G05F 1/46; H03K 3/01
(52) U.S. Cl. ....................................... 323/284; 361/187
(58) Field of Search ................................ 323/282, 283, 323/284, 285; 361/151, 154, 155, 90, 99, 187

(56) References Cited

U.S. PATENT DOCUMENTS 4,347,544 A * 8/1982 Ohba ......................... 361/154
4,680,667 A * 7/1987 Petrie ......................... 361/154
6,344,980 B1 * 2/2002 Hwang et al. ........... 363/21.01

* cited by examiner

*Primary Examiner*—Rajnikant B. Patel
(74) *Attorney, Agent, or Firm*—Lee, Mann, Smith, McWilliams, Sweeney & Ohlson

(57) ABSTRACT

In a circuit arrangement for the supply of an electrical coil (L), particularly the coil of a solenoid valve, with a predetermined operating current from a voltage source with differing operating voltages ($U_b$), the coil (L) is arranged in series with a first controllable circuit element (T2) and a current sensor (R), and the measuring signal of the current sensor (R) being compared with a reference value ($U_{ref}$) through a first comparator (1). A timed switch (2) is triggered by the output signal (A) of the comparator (1) when the measuring signal exceeds said reference value, the first circuit element (T2), activated by an operating signal (M), being disconnected by the output signal of the timed switch (2), until the measuring signal exceeds the reference value again. In order to ensure that the increasing time (t1) of the operating current (I), from switching on the operating current by the operating signal (M) till the reference value is reached, is independent of the selected size of the operating voltage, a second comparator (4) compares the measuring signal of the current sensor (R) with a signal ($U_c$) that is steadily increasing independently of a change of the operating voltage, said signal also being triggered through the operating signal (M), and the timed switch (2) is triggered by the output signal (B) of the second comparator (4), when the measuring signal exceeds the steadily increasing signal ($U_c$), before the measuring signal exceeds the reference value ($U_{ref}$).

5 Claims, 2 Drawing Sheets

(KNOWN)

CIRCUIT ARRANGEMENT FOR THE SUPPLY OF AN ELECTRICAL COIL WITH A PREDETERMINED OPERATING CURRENT

The invention concerns a circuit arrangement for the supply of an electrical coil, particularly the coil of a solenoid valve, with a predetermined operating current from a voltage source with differing operating voltages, the coil being arranged in series with a first controllable circuit element and a current sensor, and the measuring signal of the current sensor being compared with a reference value through a first comparator, and a timed switch being triggered by the output signal of the comparator when the measuring signal exceeds said reference value, the first circuit element, activated by an operating signal, being disconnected by the output signal of the timed switch, until the measuring signal exceeds the reference value again.

Figure 3:
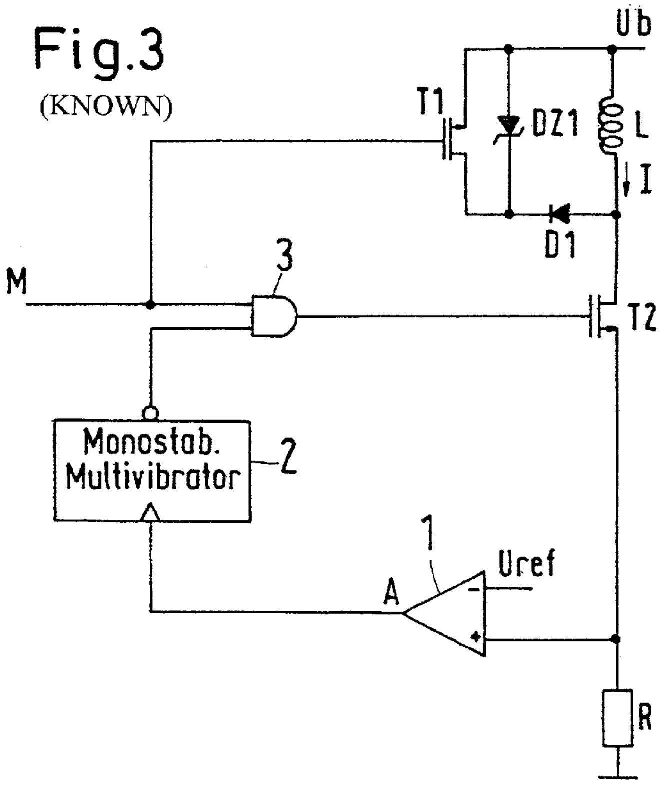

A commercially available circuit arrangement of this kind has the embodiment shown in FIG. 3. It serves the purpose of enabling the operation of the magnet coil of a solenoid valve with different operating voltages, for example with 12 Volt or 24 Volt, at the same operating current, as it is not always possible to operate the same coil over a large operating voltage range of, for example, 9 to 32 Volt: The output supplied at high operating voltage could be too high (it increases with the square of the voltage). To enable the use of the same coil in a large voltage range, for example from 9 to 32 Volt, thus avoiding the use of different coils for the different operating voltages, the known circuit arrangement keeps the current flowing through the coil L constant, independently of the actual operating voltage $U_b$. For this purpose, a transistor T2 operated as circuit element and a current sensor in the form of measuring resistor R are arranged in series with the coil L. The current measuring signal in the shape of the voltage drop caused by the current I at the resistor R is compared in a comparator 1 with a reference value Uref being substantially equal to the desired value of the current. The output signal A occurring at the outlet of the comparator 1, when the current measuring signal exceeds the reference value, triggers a timed switch in the shape of a monostable multivibrator 2, whose output signal is linked with an operating signal M through an AND-link 3. The outlet of the AND-link 3 is connected with the control connection of the transistor T2. The operating signal M occurs for as long as the solenoid valve must operate, that is, the current I has to flow. Thus, before begin of operation, the current measuring signal is lower than the reference value Uref, so that a high signal appears at the reversing outlet of the multivibrator 2 and the transistor T2 is ON (connected). As soon as the current I, increasing according to an exponential function, exceeds the reference value, a high signal A appears at the outlet of the comparator 1, which signal triggers the monostable multivibrator 2 and disconnects (blocks) the transistor T2 via the AND-link 3.

Figure 4:
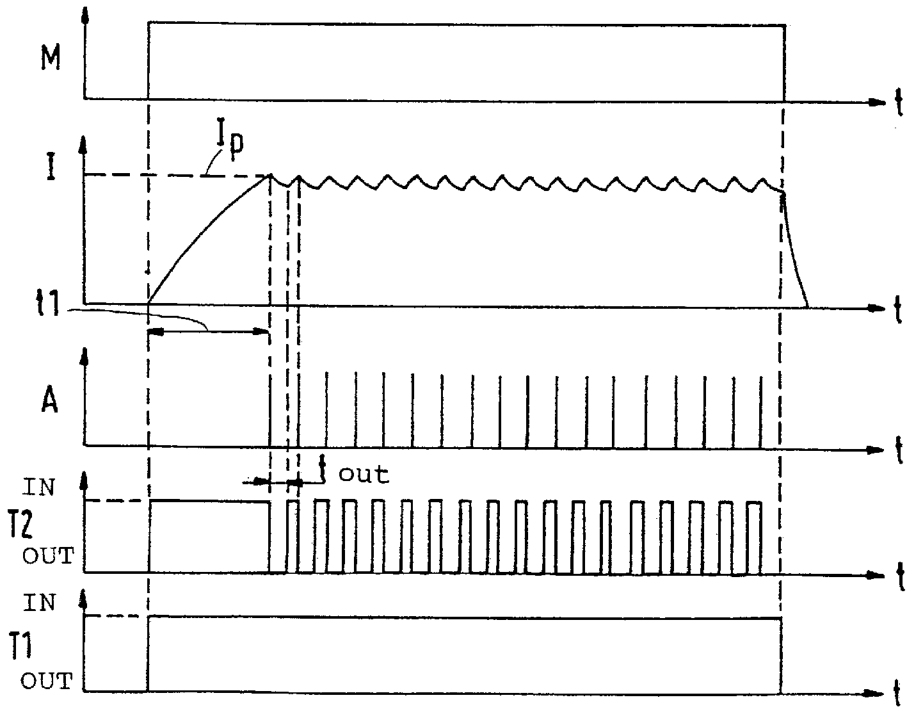

The diagrams in FIG. 4 show the mode of operation of the circuit arrangement according to FIG. 3. For the duration of the operating signal M, the current I flows. During the time t1, it increases exponentially until it reaches a peak value Ip, at which the reference value Uref is exceeded. The resulting signal A of the comparator 1 immediately blocks the transistor T2 again. However, the current I in the coil L continues to flow through a freewheeling diode $D_1$ and a transistor T1 connected anti-parallel to the coil L and a Z-diode DZ1, which transistor T1 is ON (connected) for the duration of the high operating signal M. However, in this connection, the current I also drops according to an exponential function during the disconnection duration $t_{aus}$ of the transistor T2 immediately after the disappearance of the output signal A. The monostable multivibrator 2, triggered again immediately by the disappearance of the output signal A, connects the transistor T2 again immediately after the disconnection duration $t_{aus}$ of the transistor T2 determined by the cycling time of the monostable multivibrator 2. Then, the procedure described repeats itself, until the operating signal M disappears. At the end of the operating signal M, both transistors T1 and T2 are OFF (disconnected), after which the current I flows via the freewheeling diode D1 and the Z-diode DZ1 and quickly disappears.

The actual value of the current I is then only slightly below the peak value Ip=Uref/R and corresponds to the average value of the approximately sawtooth shaped course of the current I in FIG. 4.

The increasing time of the current I, however, depends on the size of the operating voltage Ub. As the increasing time t1 determines the response speed of the solenoid valve, the function of the solenoid valve also depends on the size of the operating voltage.

The invention is therefore based on the task of providing a circuit arrangement as described in the introduction, in which the increasing time of the current flowing through the coil after begin of operation is independent of the operating voltage.

According to the invention, this task is solved in that through a second comparator the measuring signal of the current sensor is compared with a signal that is steadily increasing independently of a change of the operating voltage, said signal also being triggered through the operating signal, and the timed switch is triggered by the output signal of the second comparator, when the measuring signal exceeds the steadily increasing signal, before the measuring signal exceeds the reference value.

With this solution, the increasing time of the coil current, immediately after begin of operation until reaching the reference value, is determined by a constant increasing time of the steadily increasing signal and is therefore constant.

In a simple way, the steadily increasing signal can be the output signal of an integrator with constant input signal.

Thus, the integrator may have a capacitor on the outlet of a constant current generator.

Parallel to the capacitor, a second circuit element may be arranged that can be disconnected on the appearance of an operating signal, and vice versa.

Further, it may be ensured that the outlets of the comparators are connected with the inlet of the timed switch via an OR-link and the output signal of the timed switch is linked with the operating signal through an AND-link, whose outlet is connected with a control connection of the first circuit element.

A preferred embodiment of the invention is described in detail in the following with reference to the FIGS. 1 and 2.

The FIGS. 3 and 4 show the embodiment and function of the known circuit arrangement.

Figure 1:
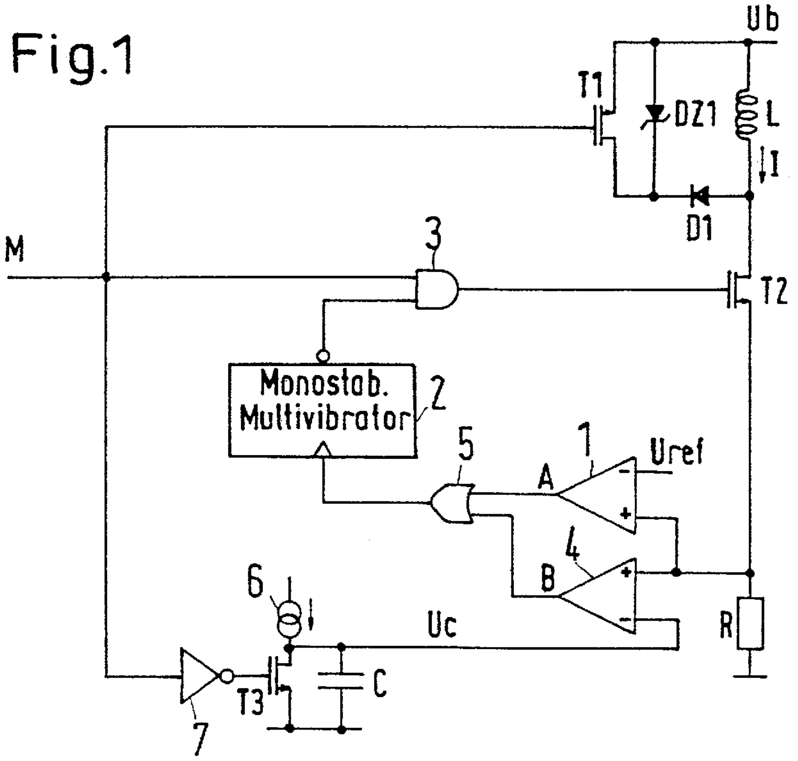
Figure 2:
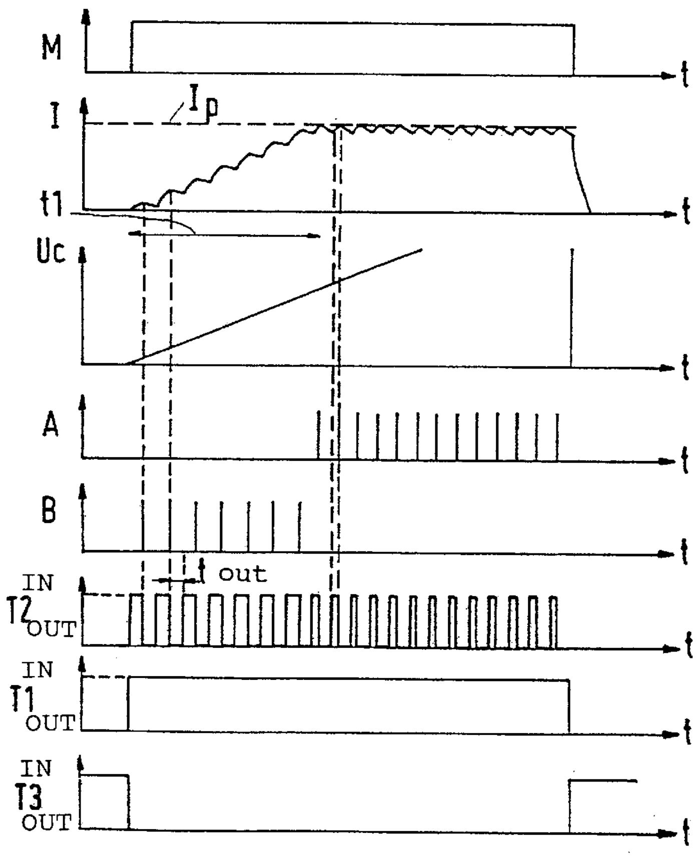

The embodiment shown in FIG. 1 of a circuit arrangement according to the invention differs from the known circuit arrangement according to FIG. 3 in that through a second comparator 4 the measuring signal of the current sensor, made as an ohmic resistor R, is compared with a signal Uc, which is steadily increasing independently of a change of the operating voltage $U_b$ according to a predetermined function, here with a constant speed, that is, linearly, which signal Uc is also triggered by the operating signal M, and that the timed switch 2 made as a monostable multivibrator is triggered by the output signal B of the second comparator 4, when the measuring signal, the voltage drop I×R, exceeds the linearly increasing signal Uc, before the measuring signal exceeds the reference value Uref. The comparator 4 thus compares the measuring signal supplied to its non-reversing inlet (+) with the linearly increasing signal Uc, and the outlets of both comparators 1, 4 are connected via an OR-link 5 with the inlet of the timed switch 2, whose output signal appearing on an inverting outlet is again linked with the operating signal M via the AND-link 3, whose outlet again is connected with the control connection of the circuit element T2, which is made as a transistor.

The linearly increasing Uc is the output signal of an integrator in the shape of a capacitor C, which is supplied through a constant current generator 6 with a constant input signal in the shape of a current charging the capacitor C. Parallel to the capacitor is an additional circuit element T3 in the shape of a transistor, which is disconnected on the occurrence of operating signal M through an inverting amplifier or a NOT-link 7, and vice versa.

Thus, before the operating signal M appears, the circuit element T2 is disconnected, as its control connection receives a low signal via the AND-link 3. Accordingly, a current I does not flow through the coil L, so that also the measuring signal is low (zero) and the output signals A and B of the comparators 1 and 4 are low. On the other hand, the output signal of the inverting amplifier 7 is high, so that the circuit element T3 is ON (connected). Thus, also the input signal of the integrator C is low, as the outlet of the current generator 6 is short-circuited. The output signal of the OR-link 5 being low in this phase causes a high output signal of the timed switch 2. Still, the output signal of the AND-link 3 and thus also the control signal on the control connection of the circuit element T2 continue to be low, until the operating signal M occurs. Also the circuit element T1 in the shape of a transistor is disconnected.

When now the operating signal M occurs to switch on the solenoid valve, the circuit elements T1 and T2 are ON (connected) and the circuit element T3 is OFF (disconnected). Subsequently, the current I starts flowing through the coil L and increasing according to an e-function. Accordingly, the signal Uc (the voltage) at the capacitor C increases linearly, as it is now charged linearly by the constant output current of the constant current generator 6. However, the output signals of the two comparators A and B continue to be low, the output signal of the timed switch 2 thus remaining high. As soon as the current measuring signal exceeds the linear signal Uc for the first time, the comparator 4 produces a high output signal B. This triggers the cycling time of the timed switch 2, during which its output signal is low, so that with the first high output signal B of the comparator 4 the circuit element T2 is disconnected again. Anyway, the current I continues to flow through the freewheeling diode D1 and the circuit element T1. However, it decreases, as shown in the diagram of the course of the current I. Simultaneously with the disconnection of the circuit element T2, however, the current measuring signal drops to zero. Therefore, only a short needle pulse appears as output signal B on the outlet of the comparator 4. When the cycling time of the timed switch 2 has lapsed, its output signal goes high again, so that the circuit element T2 is connected again. This process continues until the current I reaches the peak value Ip, at which the current measuring signal IR exceeds the reference value Uref. At this instant also the output signal A of the comparator 1 goes high, so that the timed switch 2 is triggered again, disconnecting the circuit element T2 for the duration taus of its cycling time. Subsequently, the average value of the current I flowing through the coil L remains slightly below the peak value Ip.

When the operating signal M is switched off again, the circuit elements T1 and T2 are disconnected and the circuit element T3 is connected again. The coil current then continues to flow through the freewheeling diode D1 and the Z-diode DZ1, but decreases rapidly to zero.

The average increasing speed of the current I for the time until it reaches the reference value Uref or the peak current Ip, respectively, is, however, proportional to the increasing speed of the signal Uc and thus constant, so that also the increase duration t1 of the current I is constant and independent of the operating voltage Ub. Accordingly, also the response speed of the solenoid valve with the coil L until reaching the desired value of the current I, being slightly lower than the peak current Ib, is constant and independent of the operating voltage Ub.

It must merely be observed that the increasing speed of the current I during the connected time of the circuit element T2 is always higher than that of the signal Uc, in order that the signal Uc can be exceeded before the peak value Ip is reached.

I claim:

1. Circuit arrangement for the supply of an electrical coil (L) of a solenoid valve with a predetermined operating current from a voltage source with differing operating voltages ($U_b$), the coil being arranged in series with a first controllable circuit element (T2) and a current sensor (R) having a measuring signal (I×R), and the measuring signal of the current sensor being compared with a reference value ($U_{ref}$) through a first comparator (1), and a timed switch (2) being triggered by an output signal (A) of the comparator when the measuring signal (I×R) exceeds said reference value ($U_{ref}$), the first circuit element (T2), activated by an operating signal, being disconnected by the output signal of the timed switch (2), until the measuring signal (I×R) exceeds the reference value again ($U_{ref}$), and in which through a second comparator (4) the measuring signal of the current sensor (R) is compared with a signal ($U_c$) that is steadily increasing independently of a change of the operating voltage ($U_b$), said signal also being triggered through the operating signal (M), and the timed switch (2) is triggered by an output signal (B) of the second comparator (4), when the measuring signal (I×R) exceeds the steadily increasing signal (Uc), before the measuring signal (I×R) exceeds the reference value ($U_{ref}$).

2. Circuit arrangement according to claim 1, in which the steadily increasing signal is the output signal of an integrator with constant input signal.

3. Circuit arrangement according to claim 2, in which the integrator has a capacitor on the outlet of a constant current generator.

4. Circuit arrangement according to claim 3, in which parallel to the capacitor, a second circuit element is arranged that is disconnected on the appearance of the operating signal, and vice versa.

5. Circuit arrangement according to one of the claim 1, in which the outlets of the comparators are connected with the inlet of the timed switch via an OR-link and the output signal of the timed switch is linked with the operating signal through an AND-link whose outlet is connected with a control connection of the first circuit element.

* * * * *